US012380856B2

(12) United States Patent
Park et al.

(10) Patent No.: US 12,380,856 B2
(45) Date of Patent: Aug. 5, 2025

(54) DISPLAY DEVICE HAVING VOLTAGE SUPPLY LINES IN A PERIPHERAL AREA

(71) Applicant: Samsung Display Co., LTD., Yongin-si (KR)

(72) Inventors: Junhyun Park, Yongin-si (KR); Hyeongseok Kim, Yongin-si (KR); Heejean Park, Yongin-si (KR); Sunhwa Lee, Yongin-si (KR); Mukyung Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/502,437

(22) Filed: Nov. 6, 2023

(65) Prior Publication Data

US 2024/0153460 A1    May 9, 2024

(30) Foreign Application Priority Data

Nov. 7, 2022    (KR) .......................... 10-2022-0147393

(51) Int. Cl.
*G09G 3/325*    (2016.01)
*G09G 3/20*    (2006.01)
*H10K 59/35*    (2023.01)
*H10K 102/00*    (2023.01)

(52) U.S. Cl.
CPC ............ *G09G 3/325* (2013.01); *G09G 3/2003* (2013.01); *H10K 59/351* (2023.02); *H10K 2102/351* (2023.02)

(58) Field of Classification Search
CPC ................ G09G 3/32–3291; H10K 59/00–95
See application file for complete search history.

(56) References Cited

U.S. PATENT DOCUMENTS

| | | | |
|---|---|---|---|
| 11,751,448 B2* | 9/2023 | Yoon ....................... | G06F 3/044 |
| | | | 361/679.02 |
| 11,844,248 B2* | 12/2023 | Kim ..................... | H10K 59/121 |
| 2019/0341439 A1 | 11/2019 | Choi et al. | |
| 2021/0313410 A1* | 10/2021 | Kim ..................... | H10K 59/131 |
| 2021/0391407 A1 | 12/2021 | Yoon et al. | |
| 2022/0013621 A1 | 1/2022 | Kim et al. | |
| 2022/0366852 A1 | 11/2022 | Jeong et al. | |
| 2022/0415252 A1 | 12/2022 | Moon et al. | |

FOREIGN PATENT DOCUMENTS

| KR | 10-2018-0004382 | 1/2018 |
|---|---|---|
| KR | 10-2019-0128030 | 11/2019 |
| KR | 10-2021-0154301 | 12/2021 |
| KR | 10-2022-0010667 | 1/2022 |
| KR | 10-2022-0014366 | 2/2022 |

* cited by examiner

*Primary Examiner* — Gene W Lee
(74) *Attorney, Agent, or Firm* — KILE PARK REED & HOUTTEMAN PLLC

(57) ABSTRACT

A display device includes a display area and a peripheral area disposed adjacent to the display area, a display element arranged in the display area, a first semiconductor layer, a gate conductive layer, a first connection electrode layer, and a second connection electrode layer, sequentially arranged on a substrate, and a bias voltage supply line arranged in the peripheral area. The bias voltage supply line includes a top supply line and a bottom supply line arranged on different layers, and the top supply line and the second connection electrode layer are arranged on a same layer.

19 Claims, 14 Drawing Sheets

DISPLAY DEVICE HAVING VOLTAGE SUPPLY LINES IN A PERIPHERAL AREA

CROSS-REFERENCE TO RELATED APPLICATION(S)

This application claims priority to and the benefits of Korean Patent Application No. 10-2022-0147393 under 35 U.S.C. § 119, filed on Nov. 7, 2022, in the Korean Intellectual Property Office (KIPO), the entire contents of which are incorporated herein by reference.

BACKGROUND

1. Technical Field

The disclosure relates to a display device.

2. Description of the Related Art

Recently, display devices have been used in a greater variety of ways. Display devices have become thinner and lighter in weight, and usage scopes of display devices have widened.

As display devices are used in various ways, various methods may be used to design forms of display devices, and the number of functions that may be connected or linked to display devices has been increasing.

SUMMARY

The disclosure relates to a display device with improved display quality. However, such a technical problem is not limited thereto.

Additional aspects will be set forth in part in the description which follows and, in part, will be apparent from the description, or may be learned by practice of the presented embodiments of the disclosure.

According to an embodiment, a display device may include a display area and a peripheral area disposed adjacent to the display area, a display element arranged in the display area, a first semiconductor layer, a gate conductive layer, a first connection electrode layer, and a second connection electrode layer, sequentially arranged on a substrate, and a bias voltage supply line arranged in the peripheral area. The bias voltage supply line may include a top supply line and a bottom supply line arranged on different layers, and the top supply line and the second connection electrode layer may be arranged on a same layer.

The display device may further include a functional layer arranged between the first semiconductor layer and the first connection electrode layer. The bottom supply line and the functional layer may be arranged on a same layer.

The gate conductive layer may include a gate conductive line extending in a first direction, the first connection electrode layer may include a connection electrode line extending in the first direction, the connection electrode line may be electrically connected to the gate conductive line through a contact hole in the peripheral area, and the bottom supply line may include an open area corresponding to the contact hole.

A thickness of the functional layer in a thickness direction of the substrate may be in a range of about 2000 Å to about 3000 Å.

The functional layer may include aluminum (Al).

The display device may further include a second semiconductor layer arranged on the functional layer. The gate conductive layer may include a first gate conductive layer and a second gate conductive layer arranged between the first semiconductor layer and the functional layer, and a third gate conductive layer arranged on the second semiconductor layer, and the functional layer may be arranged between the second gate conductive layer and the first connection electrode layer.

The first semiconductor layer may include a silicon semiconductor, and the second semiconductor layer may include an oxide semiconductor.

The bottom supply line and the first connection electrode layer may be arranged on a same layer.

The first connection electrode layer may include a connection electrode line extending in a first direction in the peripheral area, and the bottom supply line may include an open area through which the connection electrode line passes.

The bottom supply line and the gate conductive layer may be arranged on a same layer.

The top supply line and the bottom supply line may overlap each other in a plan view and may be electrically connected to each other through a contact hole.

The display device may further include a bias voltage line extending in a first direction in the display area. The bias voltage line may be electrically connected to the bias voltage supply line extending in a second direction in the peripheral area.

The display device may further include a driving transistor that controls a volume of a driving current flowing to the display element. The bias voltage line may transfer a bias voltage to the driving transistor.

According to an embodiment, a display device may include a display area and a peripheral area disposed adjacent to the display area, a display element arranged in the display area and including a pixel electrode, an emission layer, and an opposite electrode, a semiconductor layer, a gate conductive layer, a first connection electrode layer, and a second connection electrode layer, sequentially arranged on a substrate, and a first initialization voltage supply line, a second initialization voltage supply line, and a bias voltage supply line, arranged in the peripheral area. At least one of the first initialization voltage supply line, the second initialization voltage supply line, and the bias voltage supply line may include a top supply line and a bottom supply line arranged on different layers, and the top supply line and the second connection electrode layer may be arranged on a same layer.

The bottom supply line and the gate conductive layer may be arranged on a same layer, or the bottom supply line and the first connection electrode layer may be arranged on a same layer.

The first connection electrode layer may include a connection electrode line extending in a first direction in the peripheral area, and the bottom supply line may include an open area through which the connection electrode line passes.

The display device may further include a functional layer arranged between the semiconductor layer and the first connection electrode layer. The bottom supply line and the functional layer may be arranged on a same layer.

The gate conductive layer may include a gate conductive line extending in a first direction, the first connection electrode layer may include a connection electrode line extending in the first direction, the connection electrode line may be electrically connected to the gate conductive line through a contact hole in the peripheral area, and the bottom supply line may include an open area corresponding to the contact hole.

The functional layer may include aluminum (Al).

The display device may further include a first initialization voltage line, a second initialization voltage line, and a bias voltage line, extending in a first direction in the display area. The first initialization voltage line may be electrically connected to the first initialization voltage supply line extending in a second direction in the peripheral area, the second initialization voltage line may be electrically connected to the second initialization voltage supply line extending in the second direction in the peripheral area, and the bias voltage line may be electrically connected to the bias voltage supply line extending in the second direction in the peripheral area.

BRIEF DESCRIPTION OF THE DRAWINGS

The above and other aspects, features, and advantages of embodiments of the disclosure will be more apparent from the following description taken in conjunction with the accompanying drawings.

DETAILED DESCRIPTION OF THE EMBODIMENTS

Figure 1:
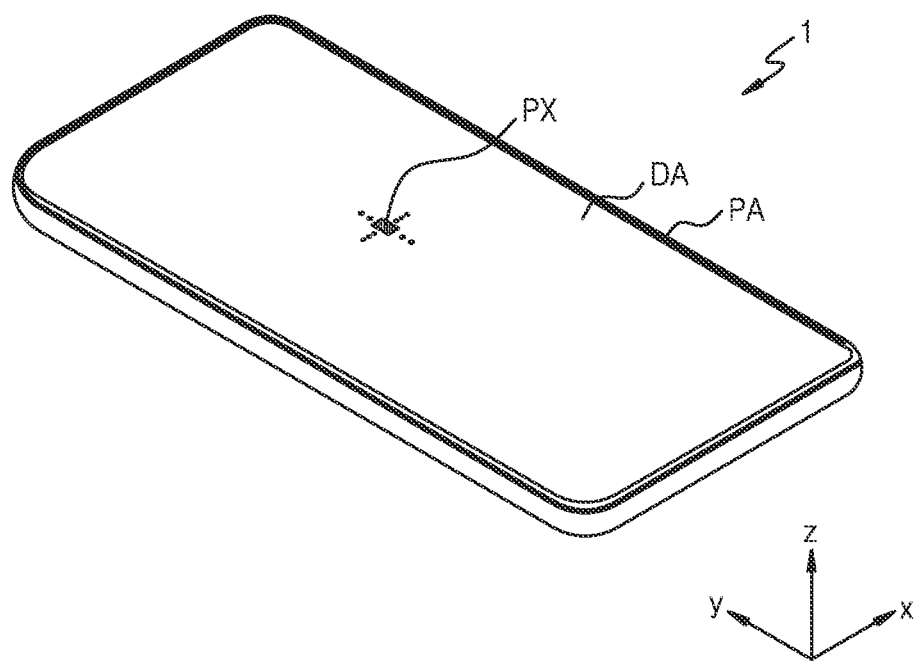
FIG. 1 is a schematic perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. Throughout the disclosure, the expression "at least one of a, b, or c" indicates only a, only b, only c, both a and b, both a and c, both b and c, all of a, b, and c, or variations thereof.

Unless otherwise specified, the illustrated embodiments are to be understood as providing example features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

As the description allows for various changes and numerous embodiments, embodiments will be illustrated in the drawings and described in the written description. Effects and features of one or more embodiments and methods of accomplishing the same will become apparent from the following detailed description of the one or more embodiments, taken in conjunction with the accompanying drawings. However, the embodiments may have different forms and should not be construed as being limited to the descriptions set forth herein.

Embodiments will be described below in more detail with reference to the accompanying drawings. Those elements that are the same or are in correspondence with each other are rendered the same reference numeral regardless of the figure number, and redundant descriptions thereof are omitted.

While such terms as "first" and "second" may be used to describe various elements, such elements must not be limited to the above terms. The above terms are used only to distinguish one element from another. Thus, a first element discussed below could be termed a second element without departing from the teachings of the disclosure.

The terminology used herein is for the purpose of describing particular embodiments and is not intended to be limiting. As used herein, the singular forms "a," "an," and "the" as used herein are intended to include the plural forms as well unless the context clearly indicates otherwise. Herein, the term "dead space" may be understood as a space which is devoted to accommodating one or more components that, either singularly or plurally, perform an intended function.

It will be understood that the terms "include," "comprise," and "have" as used herein specify the presence of stated features or elements but do not preclude the addition of one or more other features or elements. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

It will be further understood that, in case that a layer, region, or element is referred to as being on another layer, region, or element, it may be directly or indirectly on the other layer, region, or element. For example, intervening layers, regions, or elements may be present.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Sizes of elements in the drawings may be exaggerated or reduced for convenience of explanation. For example, since sizes and thicknesses of elements in the drawings are arbitrarily illustrated for convenience of explanation, the following embodiments are not limited thereto.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

When an embodiment may be implemented differently, a certain process order may be performed differently from the described order. For example, two consecutively described processes may be performed substantially at the same time or performed in an order opposite to the described order.

It will be further understood that, when layers, regions, or elements are referred to as being connected to each other, they may be directly connected to each other or may be indirectly connected to each other with intervening layers, regions, or elements therebetween. For example, when layers, regions, or elements are referred to as being electrically connected to each other, they may be directly electrically connected to each other or may be indirectly electrically connected to each other with intervening layers, regions, or elements therebetween.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 2:
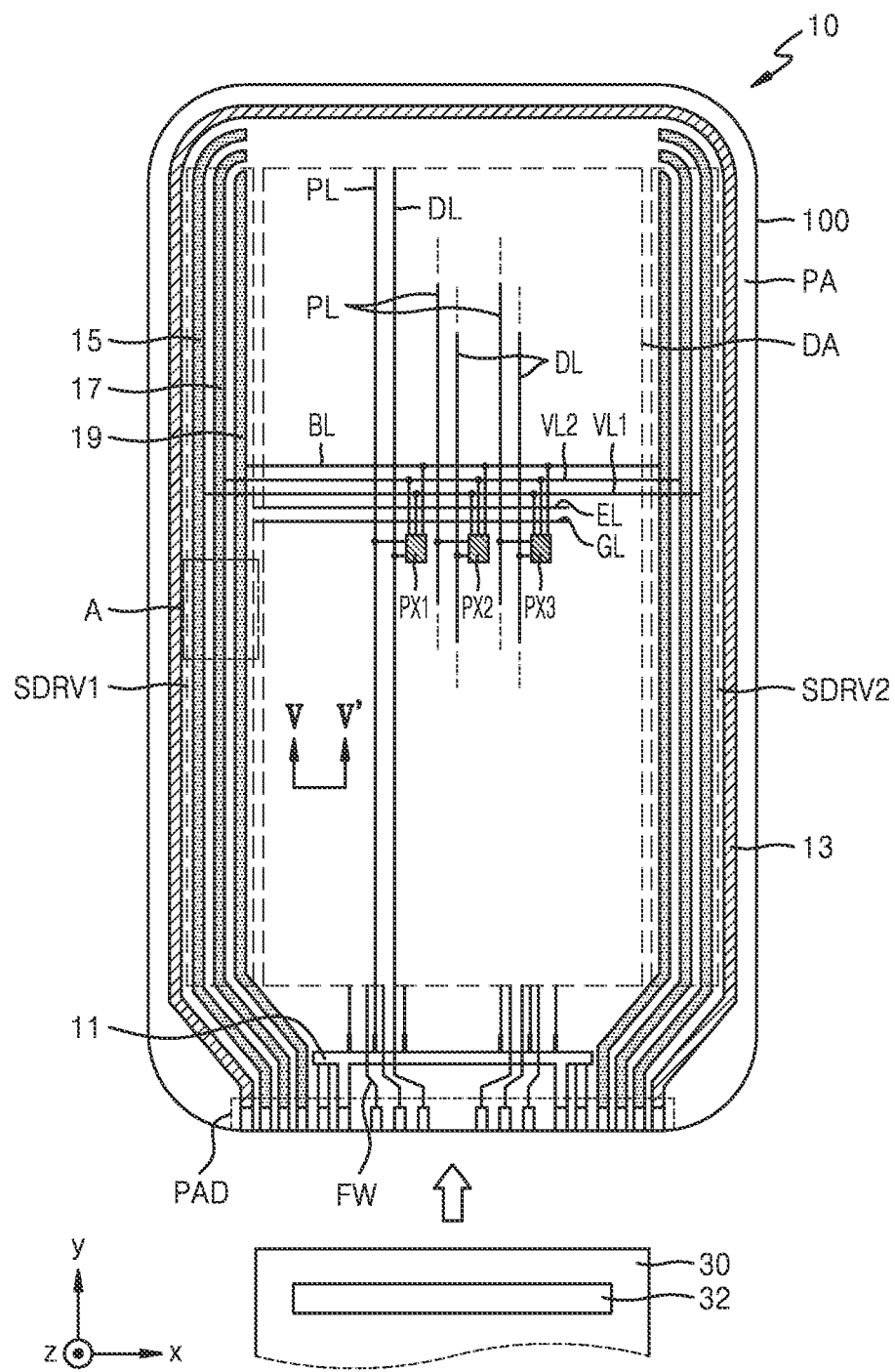
FIG. 2 is a schematic plan view of a display device according to an embodiment.

FIG. 1 is a schematic perspective view of a display device 1 according to an embodiment. FIG. 2 is a schematic plan view of the display device 1 according to an embodiment.

A display device according to an embodiment may be a device that displays a moving image or a still image, and may be used as a display screen of not only portable electronic devices, such as a mobile phone, a smartphone, a tablet personal computer (PC), a mobile communication terminal, an electronic notebook, an e-book, a portable multimedia player (PMP), a navigation system, and an ultra-mobile PC (UMPC), but also various products, such as a television, a notebook computer, a monitor, a billboard, the Internet of things (IoT), and the like. A display device according to an embodiment may be used in wearable devices, such as a smartwatch, a watch phone, a glasses-type display, a head-mounted display (HMD), and the like. A display device according to an embodiment may be used as a car's instrument panel, a center information display (CID) placed on a car's center fascia or dashboard, a room mirror display replacing a car's side mirror, a display placed on a back of a front seat as entertainment for a car's rear seat, or the like.

Referring to FIG. 1, the display device 1 may have a side in a first direction and a side in a second direction. The first direction and the second direction may be directions intersecting each other. For example, the first direction and the second direction may form an acute angle with respect to each other. In another embodiment, the first direction and the second direction may form an obtuse angle with respect to each other or may be perpendicular to each other. Hereinafter, an embodiment in which the first direction and the second direction are perpendicular to each other will be described. For example, the first direction may be a direction x or a direction -x, and the second direction may be a direction y or a direction -y. A third direction perpendicular to the first direction and the second direction may be a direction z or a direction -z.

The display device 1 may include a display area DA and a peripheral area PA disposed adjacent to (e.g., outside of) the display area DA. The display device 1 may provide an image by light emitted from multiple pixels PX arranged in the display area DA. The peripheral area PA, which is an area disposed adjacent to (e.g., outside of) the display area DA, may be a non-display area in which pixels are not arranged. The display area DA may be surrounded (e.g., entirely surrounded) by the peripheral area PA.

Although an organic light-emitting display device is described below as an embodiment of the display device 1, the disclosure is not limited thereto. In another embodiment, the display device described herein may be a display device, such as an inorganic light-emitting display (or an inorganic electroluminescent (EL) display) or a quantum dot light-emitting display. For example, an emission layer of a display element included in the display device may include an organic material or an inorganic material. In another embodiment, the display device may include an emission layer and quantum dots positioned on a path of light emitted from the emission layer.

Referring to FIG. 2, the display device 1 may include a display panel 10, and a cover window (not shown) for protecting the display panel 10 may be further disposed on the display panel 10.

Various elements constituting the display panel 10 may be disposed on a substrate 100. The substrate 100 may include the display area DA and the peripheral area PA disposed adjacent to (e.g., surrounding) the display area DA.

The pixels PX may be arranged in the display area DA. Each pixel PX may include a display element. The display element may be connected to a pixel circuit driving the pixel PX. The display element may include an organic light-emitting diode or a quantum-dot organic light-emitting diode. Each pixel PX may emit, for example, red, green, blue, or white light, through the organic light-emitting diode. The pixel PX may include a pixel circuit connected to a gate line GL and a data line DL, and an organic light-emitting diode as the display element connected to the pixel circuit.

Various wires transmitting electric signals to the display area DA, outer circuits electrically connected to pixel circuits, and pads on which a printed circuit board or a driver integrated circuit (IC) chip is attached may be located in the peripheral area PA. For example, a first scan driving circuit SDRV1, a second scan driving circuit SDRV2, a terminal portion PAD, a first power voltage supply line 11, a second power voltage supply line 13, a first initialization voltage supply line 15, a second initialization voltage supply line 17, and a bias voltage supply line 19 may be arranged in the peripheral area PA.

The first initialization voltage supply line 15, the second initialization voltage supply line 17, and the bias voltage supply line 19 may extend in the second direction (e.g., direction ±y).

The first initialization voltage supply line 15 may be connected to a first initialization voltage line VL1 extending in the first direction (e.g., direction ±x) in the display area DA and may transfer a first initialization voltage to the pixel circuit. The second initialization voltage supply line 17 may be connected to a second initialization voltage line VL2 extending in the first direction (e.g., direction ±x) in the display area DA and may transfer a second initialization voltage to the pixel circuit. The bias voltage supply line 19 may be connected to a bias voltage line BL extending in the first direction (e.g., direction ±x) in the display area DA and may transfer a bias voltage to the pixel circuit. At least one of the first initialization voltage supply line 15, the second initialization voltage supply line 17, and the bias voltage supply line 19 may include a top supply line and a bottom supply line arranged on different layers. A detailed description thereof will be given below.

The first scan driving circuit SDRV1 may apply scan signals, which are gate control signals, to pixel circuits through the gate line GL. The first scan driving circuit SDRV1 may apply emission control signals to the pixel circuits through an emission control line EL. The second scan driving circuit SDRV2 may be disposed opposite to the first scan driving circuit SDRV1 with respect to the display area DA and may be substantially parallel to the first scan driving circuit SDRV1. Some of the pixel circuits of the pixels PX of the display area DA may be electrically connected to the first scan driving circuit SDRV1, and another one of the pixel circuits of the pixels PX of the display area DA may be electrically connected to the second scan driving circuit SDRV2. The second scan driving circuit SDRV2 may be omitted. Some of the first initialization voltage supply line 15, the second initialization voltage supply line 17, and the bias voltage supply line 19 may overlap the first scan driving circuit SDRV1 and the second scan driving circuit SDRV2 in a plan view.

The terminal portion PAD may be arranged at a side of the substrate 100. The terminal portion PAD may not be covered by an insulating layer but may be exposed and connected to a display circuit board 30. A display driver 32 may be disposed on the display circuit board 30.

The display driver 32 may generate a control signal which is transmitted to the first scan driving circuit SDRV1 and the second scan driving circuit SDRV2. The display driver 32 may generate a data signal, and the generated data signal may be transmitted to the pixel circuits of the pixels PX through a fan-out wire FW and the data line DL connected to the fan-out wire FW.

The display driver 32 may supply a first power voltage ELVDD to the first power voltage supply line 11 and may supply a second power voltage ELVSS to the second power voltage supply line 13. The first power voltage ELVDD may be applied to the pixel circuits of the pixels PX through a driving voltage line PL connected to the first power voltage supply line 11, and the second power voltage ELVSS may be applied to an opposite electrode of display elements through the second power voltage supply line 13. The first power voltage supply line 11 may be connected to the terminal portion PAD and may extend in the first direction (e.g., direction x) on a lower side of the display area DA. The second power voltage supply line 13 may be connected to the terminal portion PAD and may have a loop shape with a side open and partially surround the display area DA.

Figure 3:
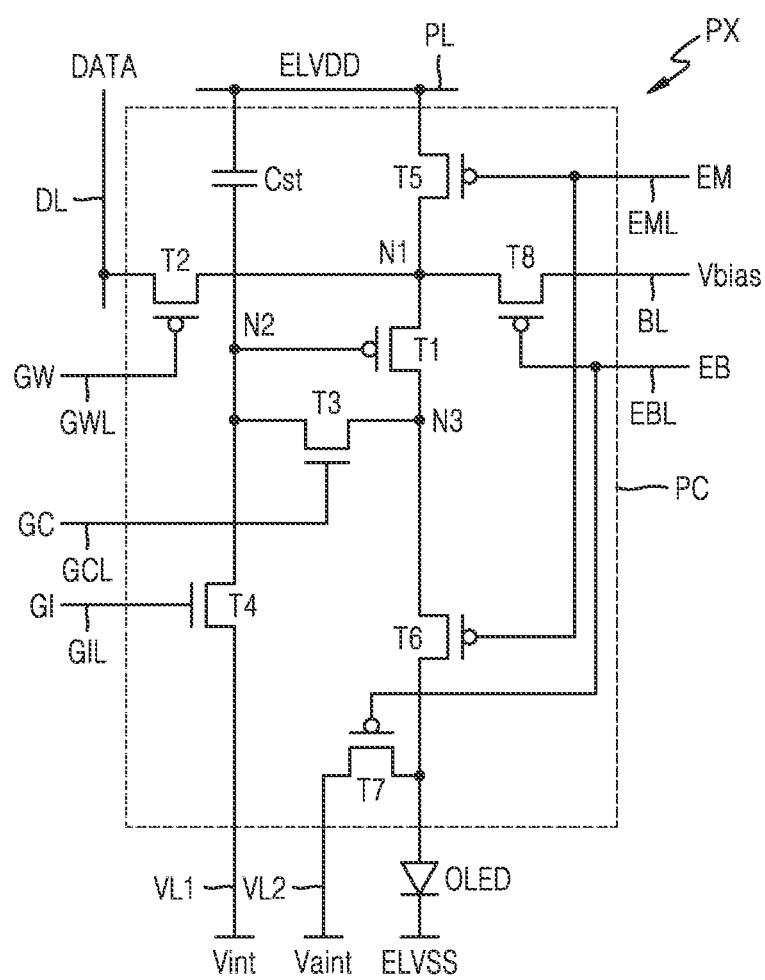
FIG. 3 is a schematic diagram of an equivalent circuit of a pixel circuit according to an embodiment.
Figure 4A:
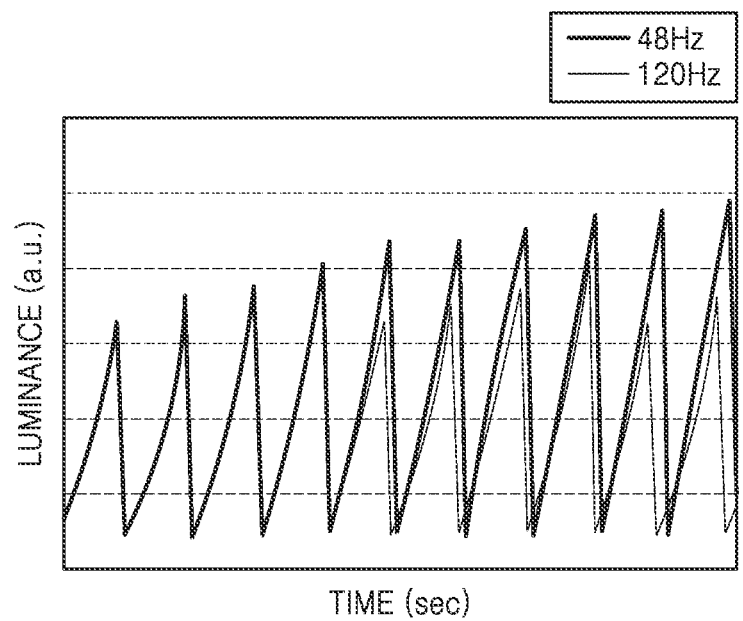
FIGS. 4A and 4B are schematic waveform views of light waveforms obtained by measuring luminance of a display device.
Figure 4B:
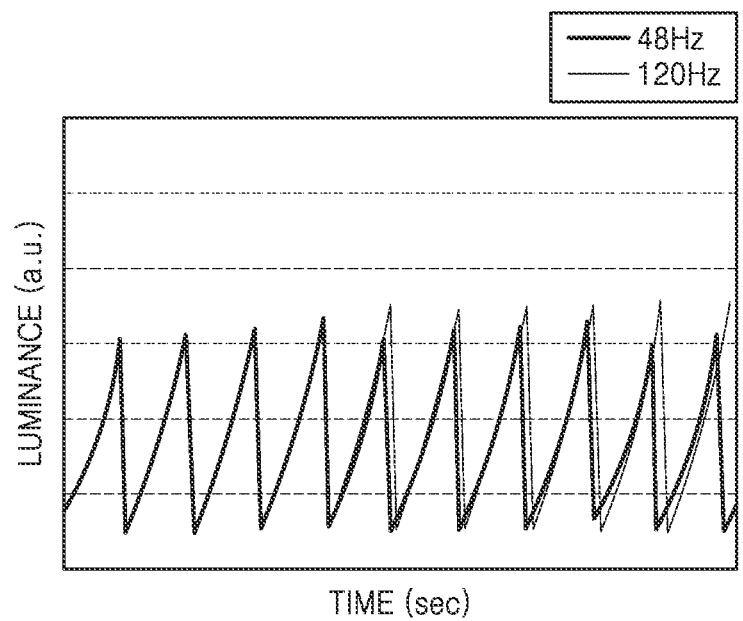

FIG. 3 is a schematic diagram of an equivalent circuit of a pixel circuit PC according to an embodiment. FIGS. 4A and 4B are schematic waveform views of a change in luminance of light waveforms according to different driving frequencies in a display device supporting a variable refresh rate (VRR).

Referring to FIG. 3, the pixel PX may include a pixel circuit PC and an organic light-emitting diode OLED as a display element connected to the pixel circuit PC. The pixel circuit PC may include first to eighth transistors T1 to T8, a capacitor Cst, and signal lines connected to the pixel circuit PC. The signal lines may include the data line DL, a first gate line GWL, a second gate line GCL, a third gate line GIL, an emission control line EML, a bias control line EBL, the first and second initialization voltage lines VL1 and VL2, the driving voltage line PL, and the bias voltage line BL.

The first gate line GWL, the second gate line GCL, the third gate line GIL, the emission control line EML, and the bias control line EBL may be gate control lines to which a gate signal for controlling turn-on and turn-off of a transistor is applied. The driving voltage line PL may transfer the first power voltage ELVDD to the first transistor T1. The first power voltage ELVDD may be a high voltage provided to a pixel electrode (a first electrode or an anode) of an organic light-emitting diode included in each pixel PX. The first initialization voltage line VL1 may transfer a first initialization voltage Vint for initializing the first transistor T1 to the pixel PX. The second initialization voltage line VL2 may transfer a second initialization voltage Vaint for initializing the organic light-emitting diode OLED to the pixel PX. The bias voltage line BL may transfer a bias voltage Vbias to the first transistor T1.

The first transistor T1 may be a driving transistor, and the second to eighth transistors T2 to T8 may be switching transistors. Depending on the type (N-type or P-type) and/or operation conditions of a transistor, a first terminal of each of the first to eighth transistors T1 to T8 may be a source terminal or a drain terminal, and a second terminal may be a terminal different from the first terminal. For example, in case that the first terminal is a source terminal, the second terminal may be a drain terminal. In an embodiment, the source terminal and the drain terminal may be interchangeably referred to as a source electrode and a drain electrode, respectively.

The first transistor T1 may be connected between the driving voltage line PL and the organic light-emitting diode OLED. The first transistor T1 may be connected to the driving voltage line PL via the fifth transistor T5 and may be electrically connected to the organic light-emitting diode OLED via the sixth transistor T6. The first transistor T1 may include a gate connected to a second node N2, a first terminal connected to a first node N1, and a second terminal connected to a third node N3. The first transistor T1 may receive a data signal according to a switching operation of the second transistor T2 and supply a driving current to the organic light-emitting diode OLED.

The second transistor T2 (data writing transistor) may be connected between the data line DL and the first node N1 and may be connected to the driving voltage line PL via the fifth transistor T5. The first node N1 may be a node to which the first transistor T1 and the fifth transistor T5 are connected. The second transistor T2 may include a gate connected to the first gate line GWL, a first terminal connected to the data line DL, and a second terminal connected to the first node N1 (or the first terminal of the first transistor T1). The second transistor T2 may be turned on according to a first gate signal GW received through the first gate line GWL to perform a switching operation for transmitting a data signal transmitted through the data line DL to the first node N1.

The third transistor T3 (compensation transistor) may be connected between the second node N2 and the third node N3. The third transistor T3 may be connected to the organic light-emitting diode OLED via the sixth transistor T6. The second node N2 may be a node to which the gate of the first transistor T1 is connected, and the third node N3 may be a node to which the first transistor T1 and the sixth transistor T6 are connected. The third transistor T3 may include a gate connected to the second gate line GCL, a first terminal connected to the second node N2 (or the gate of the first transistor T1), and a second terminal connected to the third node N3 (or the second terminal of the first transistor T1). The third transistor T3 may be turned on according to a second gate signal GC received through the second gate line GCL to diode-connect the first transistor T1, thereby compensating a threshold voltage of the first transistor T1. In an embodiment, the third transistor T3 may include a pair of sub-transistors connected in series.

The fourth transistor T4 (first initialization transistor) may be connected between the second node N2 and the first initialization voltage line VL1. The fourth transistor T4 may include a gate connected to the third gate line GIL, a first terminal connected to the second node N2, and a second terminal connected to the first initialization voltage line VL1. The fourth transistor T4 may be turned on according to a third gate signal GI received through the third gate line GIL to transfer the first initialization voltage Vint to the gate of the first transistor T1 and initialize the gate of the first transistor T1. In an embodiment, the fourth transistor T4 may include a pair of sub-transistors connected in series.

The fifth transistor T5 (first emission control transistor) may be connected between the driving voltage line PL and the first node N1. The sixth transistor T6 (second emission control transistor) may be connected between the third node N3 and the organic light-emitting diode OLED. The fifth transistor T5 may include a gate connected to the emission control line EML, a first terminal connected to the driving voltage line PL, and a second terminal connected to the first node N1. The sixth transistor T6 may include a gate connected to the emission control line EML, a first terminal connected to the third node N3, and a second terminal connected to the pixel electrode of the organic light-emitting diode OLED. The fifth transistor T5 and the sixth transistor T6 may be simultaneously turned on according to an emission control signal EM received through the emission control line EML, and a driving current may flow to the organic light-emitting diode OLED.

The seventh transistor T7 (second initialization transistor) may be connected between the organic light-emitting diode OLED and the second initialization voltage line VL2. The seventh transistor T7 may include a gate connected to the bias control line EBL, a first terminal connected to the second terminal of the sixth transistor T6 and the pixel electrode of the organic light-emitting diode OLED, and a second terminal connected to the second initialization voltage line VL2. The seventh transistor T7 may be turned on according to a bias control signal EB received through the bias control line EBL to transfer the second initialization voltage Vaint to the pixel electrode of the organic light-emitting diode OLED and initialize the pixel electrode of the organic light-emitting diode OLED. In an embodiment, the seventh transistor T7 may be omitted.

The eighth transistor T8 (bias transistor) may be connected between the first node N1 and the bias voltage line BL. The eighth transistor T8 may include a gate connected to the bias control line EBL, a first terminal connected to the bias voltage line BL, and a second terminal connected to the first node N1. The eighth transistor T8 may be turned on according to the bias control signal EB received through the bias control line EBL to apply the bias voltage Vbias to the first terminal of the first transistor T1 and reset the first terminal to a voltage suitable for a subsequent operation of the first transistor T1.

The capacitor Cst may include a first electrode and a second electrode. The first electrode may be connected to the gate of the first transistor T1, and the second electrode may be connected to the driving voltage line PL. The capacitor Cst may maintain a voltage applied to the gate of the first transistor T1 by storing and maintaining a voltage corresponding to a voltage difference between an end of the driving voltage line PL and an end the gate of the first transistor T1.

The organic light-emitting diode OLED may include a pixel electrode and an opposite electrode, and the opposite electrode may receive the second power voltage ELVSS. The second power voltage ELVSS may be a low voltage provided to the opposite electrode (a second electrode or a cathode) of the organic light-emitting diode OLED. The organic light-emitting diode OLED may receive a driving current from the first transistor T1 and emit light, thereby displaying an image.

The first power voltage ELVDD may be applied to the pixel circuits of the pixels PX through the driving voltage line PL connected to the first power voltage supply line 11, and the second power voltage ELVSS may be applied to the opposite electrode of display elements through the second power voltage supply line 13.

The first initialization voltage supply line 15 may provide the first initialization voltage Vint to the pixel circuit PC through the first initialization voltage line VL1. The second initialization voltage supply line 17 may provide the second initialization voltage Vaint through the second initialization voltage line VL2. The bias voltage supply line 19 may provide the bias voltage Vbias to the pixel circuit PC through the bias voltage line BL.

The pixel circuit PC is not limited to the numbers of transistors and capacitors and the circuit design described with reference to FIG. 3, and the numbers of transistors and capacitors and the circuit design may be variously modified. For example, in another embodiment, the pixel circuit PC may include two or more capacitors.

FIG. 4A shows a comparative example illustrating a change in luminance of light waveforms in a display device of a pixel circuit in which the eighth transistor T8 is omitted, and FIG. 4B shows a change in luminance of light waveforms in a display device of a pixel circuit including the eighth transistor T8. As shown in FIG. 4A, in the display device of the pixel circuit in which the eighth transistor T8 is omitted, during high-frequency (about 120 Hz) driving and low-frequency (about 48 Hz) driving, luminance may change (increase) over time at a low gray level due to hysteresis characteristics of the first transistor T1, thereby causing a flicker phenomenon. As shown in FIG. 4B, the bias voltage Vbias may be applied to the first terminal of the first transistor T1 by using the eighth transistor T8, and during the high-frequency driving and the low-frequency driving of the display device, a change in luminance of the display device over time at a low gray level may be decreased to improve a flicker phenomenon. During low-frequency driving, the bias voltage Vbias may be applied to the first terminal of the first transistor T1 during a holding period between data application periods, and a difference in luminance between the high-frequency driving and the low-frequency driving may be minimized.

The bias voltage supply line 19 may be arranged in the peripheral area PA in an outer region of the display device 1 to supply the bias voltage Vbias to the pixel circuit PC. The bias voltage supply line 19 may be disposed parallel to the first initialization voltage supply line 15 and the second initialization voltage supply line 17. Accordingly, dead space may increase. The display device 1 may experience degraded visibility due to a load on the bias voltage Vbias.

Figure 5A:
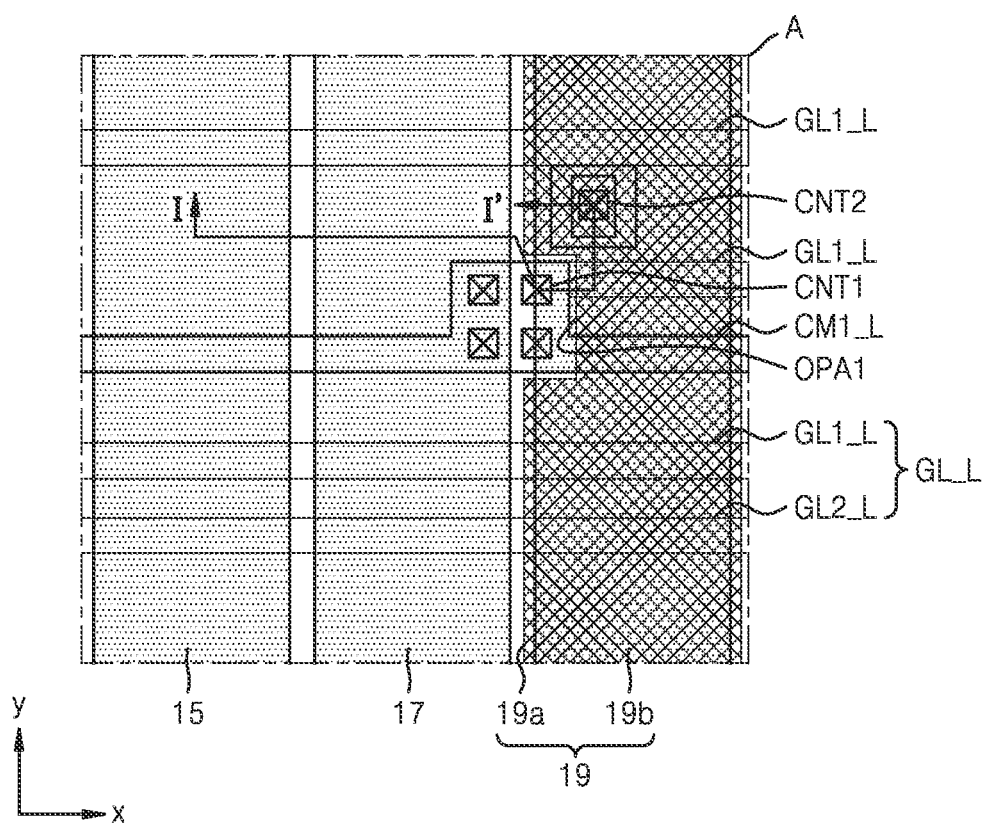
FIG. 5A is a schematic plan view of a display device according to an embodiment.
Figure 5B:
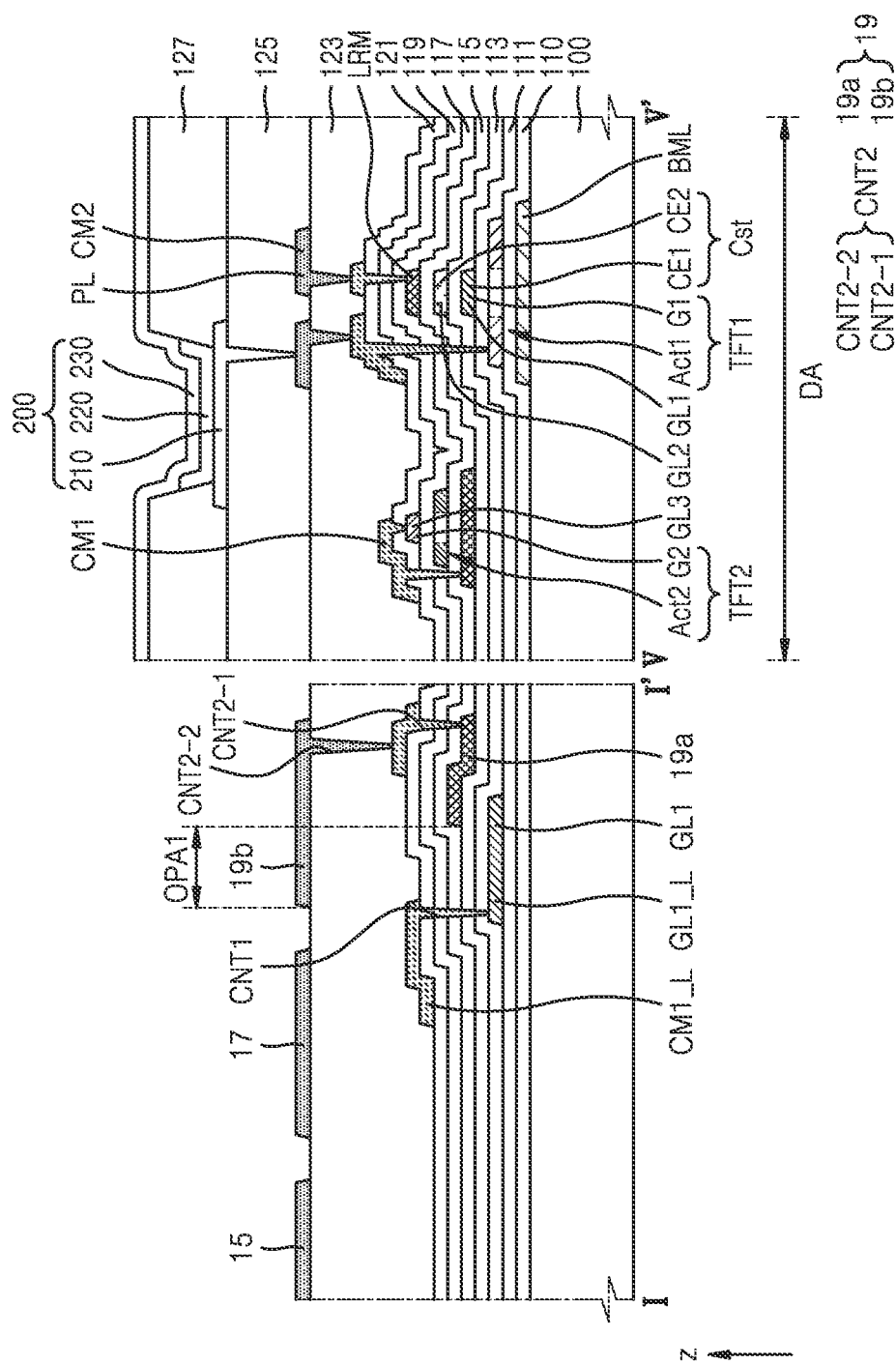
FIG. 5B is a schematic cross-sectional view of a display device according to an embodiment.

FIG. 5A is an enlarged schematic plan view of area A of FIG. 2, and FIG. 5B is a schematic cross-sectional view of the display device 1, taken along line I-I' of FIG. 5A and line V-V' of FIG. 2.

First, with reference to FIG. 5B, a structure in which configurations included in the display device 1 are stacked each other will be described focusing on the display area DA.

In the display area DA, a first thin-film transistor TFT1, a second thin-film transistor TFT2, the capacitor Cst, and a display element 200 may be disposed above the substrate 100. The first thin-film transistor TFT1 may include a first semiconductor layer Act1 and a first gate electrode G1. The second thin-film transistor TFT2 may include a second semiconductor layer Act2 and a second gate electrode G2.

The substrate 100 may include a glass, a ceramic, a metal, a flexible or bendable material, or the like. In case that the substrate 100 is flexible or bendable, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, cellulose acetate propionate, the like, or a mixture thereof.

The substrate 100 may have a single-layer or multi-layer structure including the above material. In the multi-layer structure, the substrate 100 may further include an inorganic layer. In embodiments, the substrate 100 may have a structure of an organic material/an inorganic material/an organic material.

A barrier layer (not shown) may be further disposed between the substrate 100 and a buffer layer 110. The barrier layer may prevent or minimize impurities from the substrate 100 or the like from penetrating into the first semiconductor layer Act1 and the second semiconductor layer Act2. The barrier layer may include an inorganic material, such as oxide, nitride, the like, or a combination thereof, an organic material, or an organic-inorganic compound, and may have a single-layer or multi-layer structure including an inorganic material and an organic material.

A bottom metal layer BML may be disposed between the substrate 100 and the buffer layer 110. The bottom metal layer BML may include a conductive material including molybdenum (Mo), aluminum (Al), copper (Cu), titanium (Ti), the like, an alloy thereof, or a combination thereof, and may have a multi-layer or single-layer structure including the material (e.g., conductive material).

The bottom metal layer BML may at least partially overlap the first semiconductor layer Act1 in a plan view. The bottom metal layer BML may protect the first semiconductor layer Act1. A (or preset) voltage may be applied to the bottom metal layer BML. Through the bottom metal layer BML to which the voltage is applied, unnecessary charges may be prevented from being accumulated in the first semiconductor layer Act1 in case that a pixel circuit including both an n-channel MOSFET (NMOS) and a p-channel MOSFET (PMOS) is driven. As a result, characteristics of the first thin-film transistor TFT1 including the first semiconductor layer Act1 may be stably maintained.

The first semiconductor layer Act1 may be disposed on the buffer layer 110. The first semiconductor layer Act1 may include amorphous silicon, polysilicon, or the like. The first semiconductor layer Act1 may include a channel region and source and drain regions arranged on each side of the channel region. The source region and the drain region may be regions doped by adding an impurity (dopant). The first semiconductor layer Act1 may include a single layer or multiple layers.

A first insulating layer 111 and a second insulating layer 113 may be stacked on top of each other over the substrate 100 to cover the first semiconductor layer Act1. The first insulating layer 111 and the second insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), the like, or a combination thereof. Zinc oxide ($ZnO_x$) may be zinc oxide (ZnO) and/or zinc peroxide ($ZnO_2$).

A first gate conductive layer GL1 may be disposed on the first insulating layer 111. The first gate conductive layer GL1 may include a conductive material including molybdenum (Mo), aluminum (Al), copper (Cu), titanium (Ti), the like, an alloy thereof, or a combination thereof, and may have a multi-layer or single-layer structure including the material (e.g., conductive material). A portion of the first gate conductive layer GL1 may correspond to the first gate electrode G1 of the first thin-film transistor TFT1. The first gate conductive layer GL1 may include a first gate conductive line GL1_L extending in a first direction (e.g., direction ±x).

A second gate conductive layer GL2 may be disposed on the second insulating layer 113. The second gate conductive layer GL2 may include a conductive material including molybdenum (Mo), aluminum (Al), copper (Cu), titanium (Ti), the like, an alloy thereof, or a combination thereof, and may have a multi-layer or single-layer structure including the material (e.g., conductive material). The second gate conductive layer GL2 may include a second gate conductive line GL2_L extending in the first direction (e.g., direction ±x) (see, e.g., FIG. 5A).

Partial regions of the first gate conductive layer GL1 and the second gate conductive layer GL2 may overlap each other in a plan view with the second insulating layer 113 disposed between the first gate conductive layer GL1 and the second gate conductive layer GL2, and may form a capacitance. The second insulating layer 113 may serve as a dielectric layer of the capacitor Cst.

A third insulating layer 115 may be disposed over the second insulating layer 113 to cover the second gate conductive layer GL2. The third insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), the like, or a combination thereof. Zinc oxide ($ZnO_x$) may be zinc oxide (ZnO) and/or zinc peroxide ($ZnO_2$).

A functional layer LRM may be disposed on the third insulating layer 115. The functional layer LRM may have a low sheet resistance. A sheet resistance of the functional layer LRM may be about 0.2Ω/□. The functional layer LRM may be a low-resistance metal layer. The functional layer LRM may include a conductive material including aluminum (Al), titanium (Ti), molybdenum (Mo), copper (Cu), the like, an alloy thereof, or a combination thereof, and may have a multi-layer or single-layer structure including the material (e.g., conductive material). A thickness of the functional layer LRM may be in a range of about 2000 Å to about 3000 Å.

Partial regions of the functional layer LRM and the second gate conductive layer GL2 may overlap each other in a plan view with the third insulating layer 115 disposed between the functional layer LRM and the second gate conductive layer GL2, and may form a capacitance. The third insulating layer 115 may serve as a dielectric layer.

A partial region of the functional layer LRM may overlap the second semiconductor layer Act2 in a plan view. A portion of the functional layer LRM overlapping the second semiconductor layer Act2 may protect the second semiconductor layer Act2.

A fourth insulating layer 117 may be disposed over the third insulating layer 115 and cover the functional layer LRM. The fourth insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), the like, or a combination thereof. Zinc oxide ($ZnO_x$) may be zinc oxide (ZnO) and/or zinc peroxide ($ZnO_2$).

The second semiconductor layer Act2 may be disposed on the fourth insulating layer 117. The second semiconductor layer Act2 may include an oxide semiconductor material. The second semiconductor layer Act2 may include, for example, oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), zinc (Zn), and the like.

For example, the second semiconductor layer Act2 may be an ITZO (InSnZnO) semiconductor layer, an IGZO (InGaZnO) semiconductor layer, or the like. Because an oxide semiconductor has a wide band gap (about 3.1 eV), high carrier mobility, and low leakage current, a voltage drop may not be much even in case that a driving time is long, and a change in luminance due to the voltage drop may not be much even during low-frequency driving.

The second semiconductor layer Act2 may include a channel region and source and drain regions arranged on each side of the channel region. The second semiconductor layer Act2 may include a single layer or multiple layers.

As described above, a portion of the functional layer LRM may be disposed under the second semiconductor layer Act2. Because the second semiconductor layer Act2 including an oxide semiconductor material is vulnerable to light, the second semiconductor layer Act2 may be protected by the functional layer LRM. The functional layer LRM may prevent element characteristics of the second thin-film transistor TFT2 including an oxide semiconductor material from being changed due to an occurrence of a photocurrent on the second semiconductor layer Act2 by external light incident from the substrate 100.

FIGS. 5A and 5B show a fifth insulating layer 119 disposed over the entire surface of the substrate 100 and cover the second semiconductor layer Act2. However, in another embodiment, the fifth insulating layer 119 may be patterned to overlap a portion of the second semiconductor layer Act2. For example, the fifth insulating layer 119 may be patterned to overlap the channel region of the second semiconductor layer Act2 in a plan view.

A third gate conductive layer GL3 may be disposed on the fifth insulating layer 119. The third gate conductive layer GL3 may include a conductive material including molybdenum (Mo), aluminum (Al), copper (Cu), titanium (Ti), the like, an alloy thereof, or a combination thereof, and may have a multi-layer or single-layer structure including the material (e.g., conductive material). A portion of the third gate conductive layer GL3 may correspond to the second gate electrode G2 of the second thin-film transistor TFT2. The third gate conductive layer GL3 may include a third gate conductive line GL3_L extending in the first direction (e.g., direction ±x).

A sixth insulating layer 121 may be disposed over the fifth insulating layer 119 to cover the third gate conductive layer GL3. The sixth insulating layer 121 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), the like, or a combination thereof. Zinc oxide ($ZnO_x$) may be zinc oxide (ZnO) and/or zinc peroxide ($ZnO_2$).

A first connection electrode layer CM1 may be disposed on the sixth insulating layer 121. The first connection electrode layer CM1 may include a conductive material including molybdenum (Mo), aluminum (Al), copper (Cu), titanium (Ti), the like, an alloy thereof, or a combination thereof, and may have a multi-layer or single-layer structure including the material (e.g., conductive material). For example, the first connection electrode layer CM1 may have a multi-layer structure of Ti/Al/Ti.

The first connection electrode layer CM1 may be connected to the first semiconductor layer Act1, the second semiconductor layer Act2, the first to third gate conductive layers GL1, GL2, and GL3, and the functional layer LRM through a contact hole formed in at least one of the first to sixth insulating layers 111, 113, 115, 117, 119, and 121. A portion of the first connection electrode layer CM1 may be filled in the contact hole.

A first planarization layer 123 and a second planarization layer 125 may be stacked on top of each other on the sixth insulating layer 121. The first planarization layer 123 and the second planarization layer 125 may have a single-layer or multi-layer structure including an organic material and provide a flat top surface. The first planarization layer 123 and the second planarization layer 125 may include a general commercial polymer, such as benzocyclobutene (BCB), polyimide, hexamethyldisiloxane (HMDSO), poly(methyl methacrylate) (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, the like, or a blend thereof.

A second connection electrode layer CM2 may be disposed on the first planarization layer 123. The second connection electrode layer CM2 may include the driving voltage line PL. The second connection electrode layer CM2 may include a conductive material including molybdenum (Mo), aluminum (Al), copper (Cu), titanium (Ti), the like, an alloy thereof, or a combination thereof, and may have a multi-layer or single-layer structure including the material (e.g., conductive material). In an embodiment, the second connection electrode layer CM2 may have a multi-layer structure of Ti/Al/Ti. The second connection electrode layer CM2 may be connected to the first connection electrode layer CM1 through a contact hole formed in the first planarization layer 123. A portion of the second connection electrode layer CM2 may be filled in the contact hole.

The display element 200 may be disposed on the second planarization layer 125. The display element 200 may include a pixel electrode 210, an intermediate layer 220 including an organic emission layer, and an opposite electrode 230.

The pixel electrode 210 may be a (semi)transmissive electrode or a reflective electrode. In embodiments, the pixel electrode 210 may include a reflective layer including silver (Ag), magnesium (Mg), aluminum (Al), platinum (Pt), palladium (Pd), gold (Au), nickel (Ni), neodymium (Nd), iridium (Jr), chromium (Cr), and the like, or a compound thereof, and a transparent or semitransparent electrode layer on the reflective layer. The transparent or semitransparent electrode layer may include at least one selected from the group consisting of indium tin oxide (ITO), indium zinc oxide (IZO), zinc oxide (ZnO), indium oxide ($In_2O_3$), indium gallium oxide (IGO), aluminum zinc oxide (AZO), the like, or a combination thereof. In embodiments, the pixel electrode 210 may have a structure of ITO/Ag/ITO.

The pixel electrode 210 may be connected to the second connection electrode layer CM2 through a contact hole formed in the second planarization layer 125. A portion of the pixel electrode 210 may be filled in the contact hole, and the pixel electrode 210 and the second connection electrode layer CM2 may be connected to each other. The pixel electrode 210 may be electrically connected to the first semiconductor layer Act1 through the second connection electrode layer CM2 and the first connection electrode layer CM1.

A pixel-defining layer 127 may be disposed on the second planarization layer 125. The pixel-defining layer 127 may prevent an arc or the like from occurring at an edge of the pixel electrode 210 by increasing a distance between the edge of the pixel electrode 210 and the opposite electrode 230 above the pixel electrode 210.

The pixel-defining layer 127 may include one or more organic insulating materials selected from the group consisting of polyimide, polyamide, acrylic resin, BCB, phenolic resin, the like, and a mixture thereof, and may be formed by a method such as spin coating. The pixel-defining layer 127 may include an organic insulating material. In another embodiment, the pixel-defining layer 127 may include an inorganic insulating material, such as silicon nitride, silicon oxynitride, silicon oxide, the like, or a combination thereof. In another embodiment, the pixel-defining layer 127 may include an organic insulating material and an inorganic insulating material. In embodiments, the pixel-defining layer 127 may include a light-blocking material and may be in black or the like. The light-blocking material may include carbon black, carbon nanotubes, resin or paste including black dye, metal particles, for example, nickel (Ni), aluminum (Al), molybdenum (Mo), the like, and alloys thereof, metal oxide particles (e.g., chromium oxide), metal nitride particles (e.g., chromium nitride), the like, or a combination thereof. In case that the pixel-defining layer 127 includes a light-blocking material, a reflection of external light caused by metal structures below the pixel-defining layer 127 may be reduced.

The intermediate layer 220 may be arranged in an opening formed by the pixel-defining layer 127. The intermediate layer 220 may include an organic emission layer. The organic emission layer may include an organic material including a fluorescent or phosphorescent material that emits red, green, blue, or white light. The organic emission layer may include a low-molecular weight organic material or a polymer organic material, and a functional layer, such as a hole transport layer (HTL), a hole injection layer (HIL), an electron transport layer (ETL), an electron injection layer (EIL), the like, or a combination thereof, may be selectively further disposed under and on the organic emission layer.

The intermediate layer 220 may correspond to each of the pixel electrodes 210. However, the disclosure is not limited thereto. Various modifications may be made, for example, the intermediate layer 220 may include a single layer that covers the pixel electrodes 210.

The opposite electrode 230 may be a light-transmitting electrode or a reflective electrode. In embodiments, the opposite electrode 230 may be a transparent or semitransparent electrode and may include a thin metal film having a low work function and including Li, Ca, LiF/Ca, LiF/Al, Al, Ag, Mg, the like, or a compound thereof. A transparent conductive oxide (TCO) film, such as ITO, IZO, ZnO, $In_2O_3$, the like, or a combination thereof, may be further disposed on the metal thin film. The opposite electrode 230 may be arranged in the display area DA and may be disposed on the intermediate layer 220 and the pixel-defining layer 127. The opposite electrode 230 may be formed as a single electrode for multiple display elements 200 to correspond to the pixel electrodes 210.

The display element 200 may be covered by an encapsulation layer (not shown). The encapsulation layer may include at least one organic encapsulation layer and at least one inorganic encapsulation layer. The at least one inorganic encapsulation layer may include one or more inorganic materials among aluminum oxide, titanium oxide, tantalum oxide, hafnium oxide, zinc oxide, silicon oxide, silicon nitride, silicon oxynitride, the like, and a combination thereof. The at least one inorganic encapsulation layer may have a single-layer or multi-layer structure including the material (e.g., inorganic material). The at least one organic encapsulation layer may include a polymer-based material. Examples of the polymer-based material may include an acryl-based resin, such as polymethyl methacrylate and polyacrylic acid, epoxy-based resin, polyimide, polyethylene, the like, or a mixture thereof. In an embodiment, the at least one organic encapsulation layer may include an acrylate polymer.

Although FIGS. 5A and 5B show each of the first to sixth insulating layers 111, 113, 115, 117, 119, and 121 having a same thickness, the disclosure is not limited thereto, and various modifications may be made.

Hereinafter, configurations arranged in the peripheral area PA of the display device 1 will be described.

Referring to FIGS. 5A and 5B, in an embodiment, at least one of the first initialization voltage supply line 15, the second initialization voltage supply line 17, and the bias voltage supply line 19 may be arranged in the peripheral area PA of the display device 1. The first initialization voltage supply line 15, the second initialization voltage supply line 17, and the bias voltage supply line 19 may extend in a second direction (e.g., direction ±y).

At least one of the first initialization voltage supply line 15, the second initialization voltage supply line 17, and the bias voltage supply line 19 included in the display device 1 according to an embodiment may include a bottom supply line and a top supply line arranged on different layers. However, for simplification of illustration and description, the bias voltage supply line 19 is illustrated and described among the first initialization voltage supply line 15, the second initialization voltage supply line 17, and the bias voltage supply line 19.

The first gate conductive layer GL1 may include the first gate conductive line GL1_L extending in a first direction (e.g., direction ±x). The second gate conductive layer GL2 may include the second gate conductive line GL2_L extending in the first direction (e.g., direction ±x). The first gate conductive line GL1_L and/or the second gate conductive line GL2_L may be arranged in the peripheral area PA. The first connection electrode layer CM1 may include a connection electrode line CM1_L extending in the first direction (e.g., direction ±x). The connection electrode line CM1_L may be arranged in the peripheral area PA. In the peripheral area PA, the connection electrode line CM1_L may be connected to a gate conductive line GL_L, such as the first gate conductive line GL1_L and the second gate conductive line GL2_L, through a contact hole CNT1.

Referring to FIGS. 5A and 5B together, the bias voltage supply line 19 may include a bottom supply line 19a and a top supply line 19b. The bottom supply line 19a and the top supply line 19b may be arranged on different layers. The bottom supply line 19a and the top supply line 19b may overlap each other in a plan view. The bottom supply line 19a and the top supply line 19b may be connected to each other through contact holes CNT2-1 and CNT2-2.

The top supply line 19b and the second connection electrode layer CM2 may be arranged on a same layer. The top supply line 19b and the second connection electrode layer CM2 may include a same material. The top supply line 19b and the second connection electrode layer CM2 may have a same thickness in the third direction (e.g., direction z). The top supply line 19b may have low resistance. The top supply line 19b and the second connection electrode layer CM2 may have a sheet resistance of about 0.05 Ω/□.

The bottom supply line 19a and the functional layer LRM may be arranged on a same layer. The bottom supply line 19a and the functional layer LRM may include a same material. The bottom supply line 19a and the functional layer LRM may have a same thickness in the third direction. The bottom supply line 19a may have a low resistance value. A sheet resistance of the bottom supply line 19a may be about 0.2 Ω/□.

For example, the bias voltage supply line 19 may include multiple wires including a low-resistance wire, thereby decreasing a load of the bias voltage Vbias. Accordingly, visibility of the display device 1 may be improved.

As shown in FIG. 5B, in case that the bottom supply line 19a and the functional layer LRM is arranged on the same layer, the bottom supply line 19a may be disposed between the first gate conductive layer GL1 and the first connection electrode layer CM1. The bottom supply line 19a may be disposed between the second gate conductive layer GL2 and the first connection electrode layer CM1. The bottom supply line 19a may overlap the gate conductive line GL_L, such as the first gate conductive line GL1_L and the second gate conductive line GL2_L, extending to the peripheral area PA in a plan view. The bottom supply line 19a may overlap the connection electrode line CM1_L extending to the peripheral area PA in a plan view.

The peripheral area PA may include the contact hole CNT1 through which the connection electrode line CM1_L is connected to the gate conductive line GL_L, such as the first gate conductive line GL1_L and the second gate conductive line GL2_L. The bottom supply line 19a may include a first open area OPA1 corresponding to the contact hole CNT1. The first open area OPA1 may be an area offset in the first direction (e.g., direction ±x) from an edge of the bottom supply line 19a extending in the second direction (e.g., direction ±y). As the bottom supply line 19a includes the first open area OPA1, the contact hole CNT1 may overlap an area where the bias voltage supply line 19 is arranged.

The top supply line 19b of the bias voltage supply line 19 included in the display device 1 according to an embodiment may be arranged on the same layer as the second connection electrode layer CM2 and thus disposed above the first to third gate conductive layers GL1 to GL3 and the first connection electrode layer CM1, and the bottom supply line 19a may include the first open area OPA1 corresponding to the contact hole CNT1 for connecting the first connection electrode layer CM1 and the first to third gate conductive layers GL1, GL2, and GL3 to each other. Accordingly, a dead space of the display device 1 due to the bias voltage supply line 19 may be minimized.

Figure 6A:
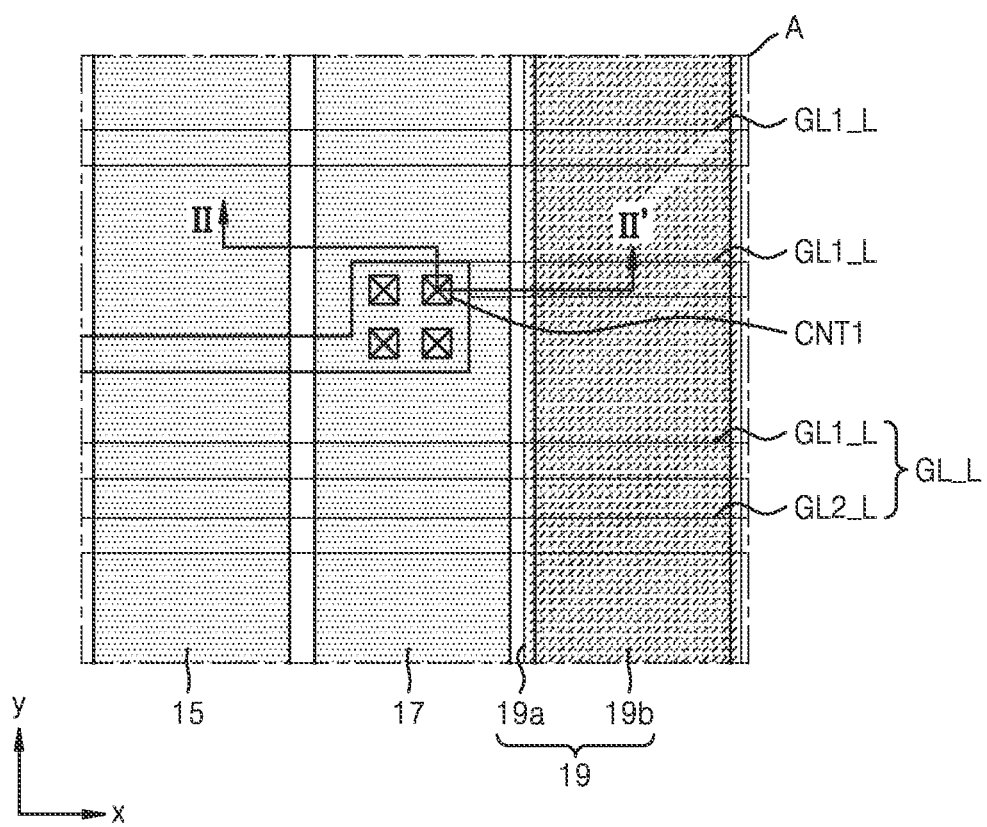
FIG. 6A is a schematic plan view of a display device according to an embodiment.
Figure 6B:
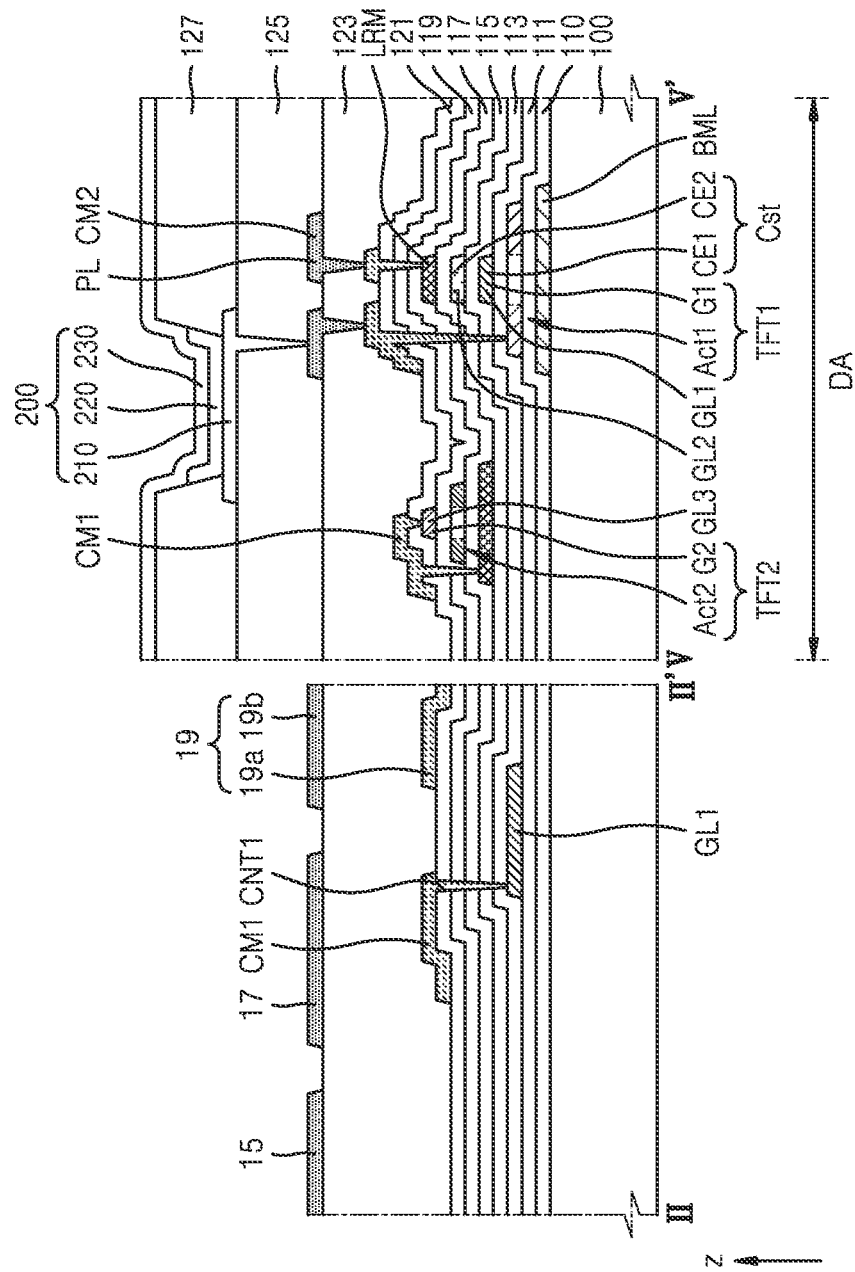
FIG. 6B is a schematic cross-sectional view of a display device according to an embodiment.

FIG. 6A is an enlarged schematic plan view of area A of FIG. 2, and FIG. 6B is a schematic cross-sectional view of the display device 1, taken along line II-II' of FIG. 6A and line V-V' of FIG. 2. Reference numerals that are the same as reference numerals in FIGS. 5A and 5B denote same elements, and a redundant description thereof is omitted.

Referring to FIGS. 6A and 6B, the bias voltage supply line 19 arranged in the peripheral area PA may include the top supply line 19b and the bottom supply line 19a, and unlike FIGS. 5A and 5B, the bottom supply line 19a and the first connection electrode layer CM1 may be arranged on a same layer. The bottom supply line 19a and the first connection electrode layer CM1 may include a same material and may have a same thickness in the third direction. The bottom supply line 19a and the first connection electrode layer CM1 may have a same sheet resistance. A sheet resistance of the bottom supply line 19a may be about 0.05Ω/□. For example, the bias voltage supply line 19 may include multiple wires including a low-resistance wire.

Figure 7A:
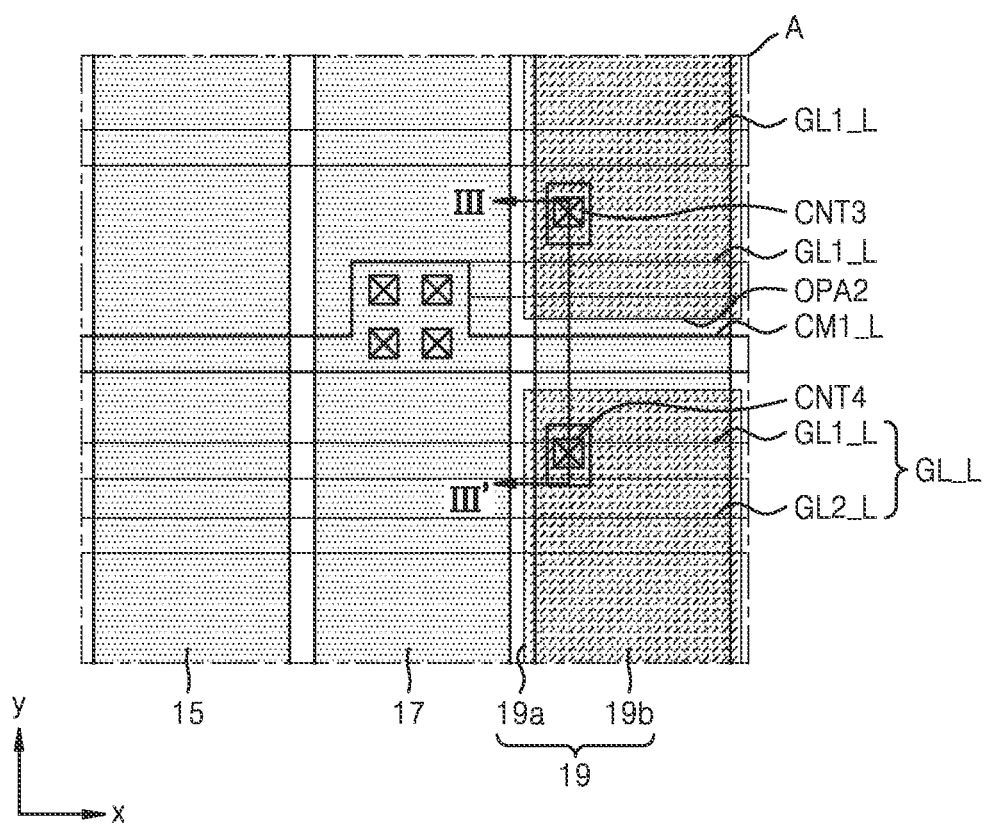
FIG. 7A is a schematic plan view of a display device according to an embodiment.
Figure 7B:
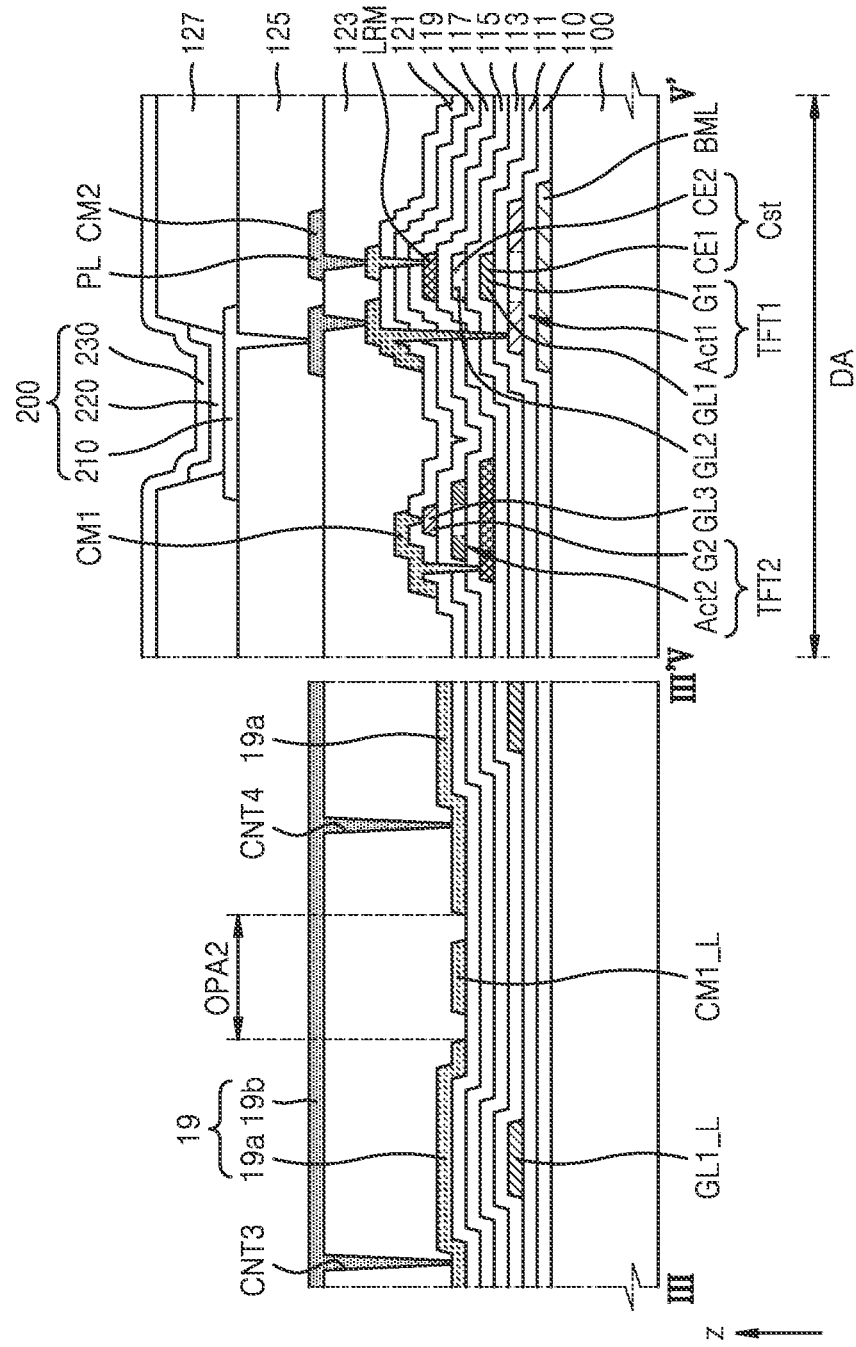
FIG. 7B is a schematic cross-sectional view of a display device according to an embodiment.

FIG. 7A is an enlarged schematic plan view of area A of FIG. 2, and FIG. 7B is a schematic cross-sectional view of the display device 1, taken along line III-III' of FIG. 7A and line V-V' of FIG. 2. Reference numerals that are the same as reference numerals in FIG. 5A, etc. denote same elements, and a redundant description thereof is omitted.

Referring to FIG. 7A, the bias voltage supply line 19 arranged in the peripheral area PA may include the top supply line 19b and the bottom supply line 19a, and like FIGS. 6A and 6B, the bottom supply line 19a and the first connection electrode layer CM1 may be arranged on the same layer.

The first connection electrode layer CM1 may include the connection electrode line CM1_L extending in a first direction (e.g., direction ±x). The connection electrode line CM1_L may be arranged in the peripheral area PA. The connection electrode line CM1_L may overlap the bias voltage supply line 19. The connection electrode line CM1_L may overlap the top supply line 19b of the bias voltage supply line 19.

The bottom supply line 19a of the bias voltage supply line 19 may include a second open area OPA2 corresponding to the connection electrode line CM1_L overlapping the top supply line 19b. The connection electrode line CM1_L may pass through the second open area OPA2 and extend in the first direction (e.g., direction ±x). Portions of the bottom supply line 19a spaced apart by the second open area OPA2 may be connected to the top supply line 19b through contact holes CNT3 and CNT4.

The bottom supply line 19a of the bias voltage supply line 19 may include the second open area OPA2 corresponding to the connection electrode line CM1_L and overlap the connection electrode line CM1_L. Accordingly, design such as arrangement of the bias voltage supply line 19 may be simple.

Figure 8A:
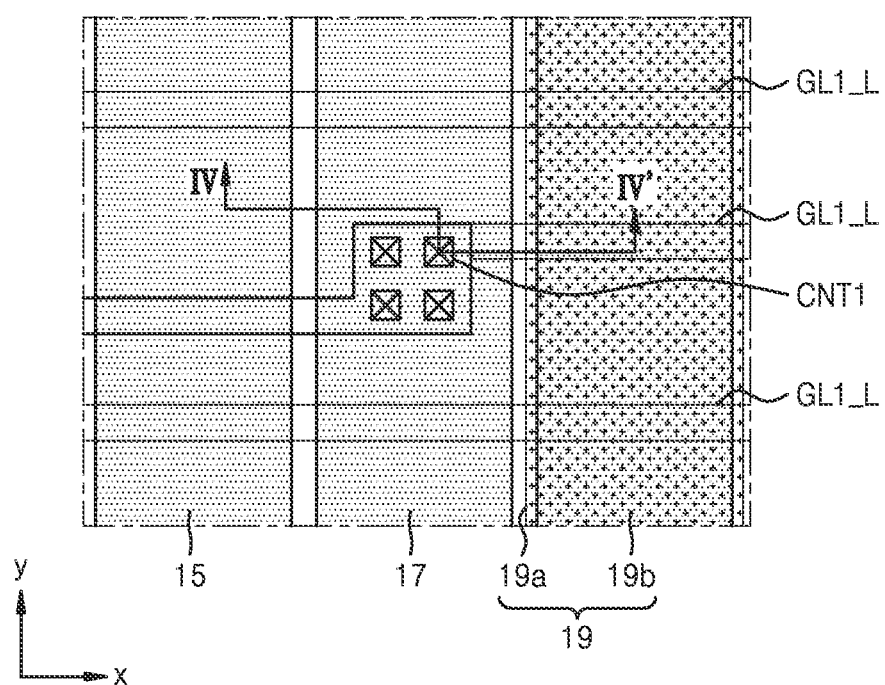
FIG. 8A is a schematic plan view of a display device according to an embodiment.
Figure 8B:
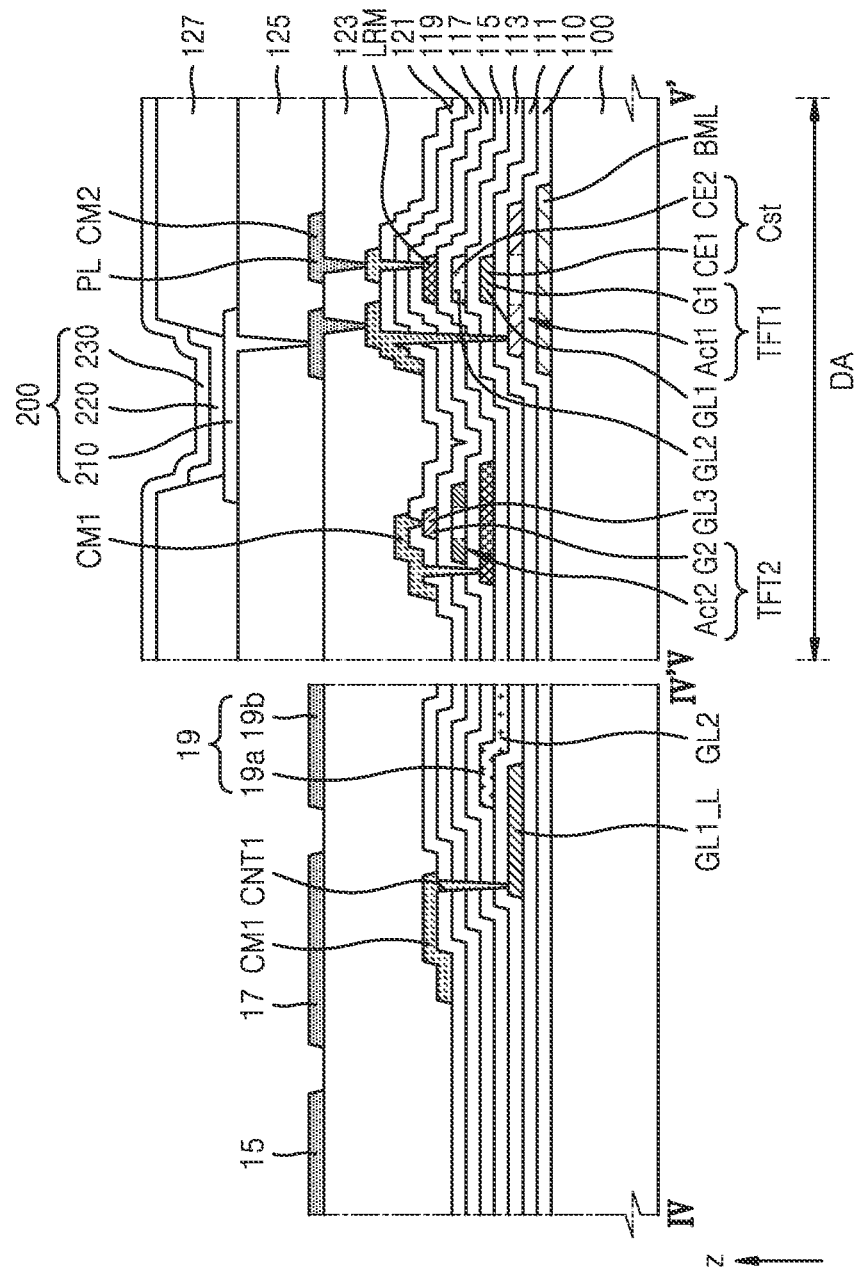
FIG. 8B is a schematic cross-sectional view of a display device according to an embodiment.

FIG. 8A is an enlarged schematic plan view of area A of FIG. 2, and FIG. 8B is a schematic cross-sectional view of the display device 1, taken along line IV-IV' of FIG. 8A and line V-V' of FIG. 2. Reference numerals that are the same as reference numerals in FIG. 5A, etc. denote same elements, and a redundant description thereof is omitted.

Referring to FIG. 8A, the bias voltage supply line 19 arranged in the peripheral area PA may include the top supply line 19b and the bottom supply line 19a, and unlike FIGS. 5A to 7B, the bottom supply line 19a and a gate conductive layer may be arranged on the same layer.

The bottom supply line 19a and the second gate conductive layer GL2 may be arranged on a same layer. The bottom supply line 19a and the second gate conductive layer GL2 may include a same material and may have a same thickness in the third direction. The bottom supply line 19a and the second gate conductive layer GL2 may have a same sheet resistance. A sheet resistance of the bottom supply line 19a may be about 0.48Ω/□. For example, the bias voltage supply line 19 may include multiple wires including a low-resistance wire.

Figure 9:
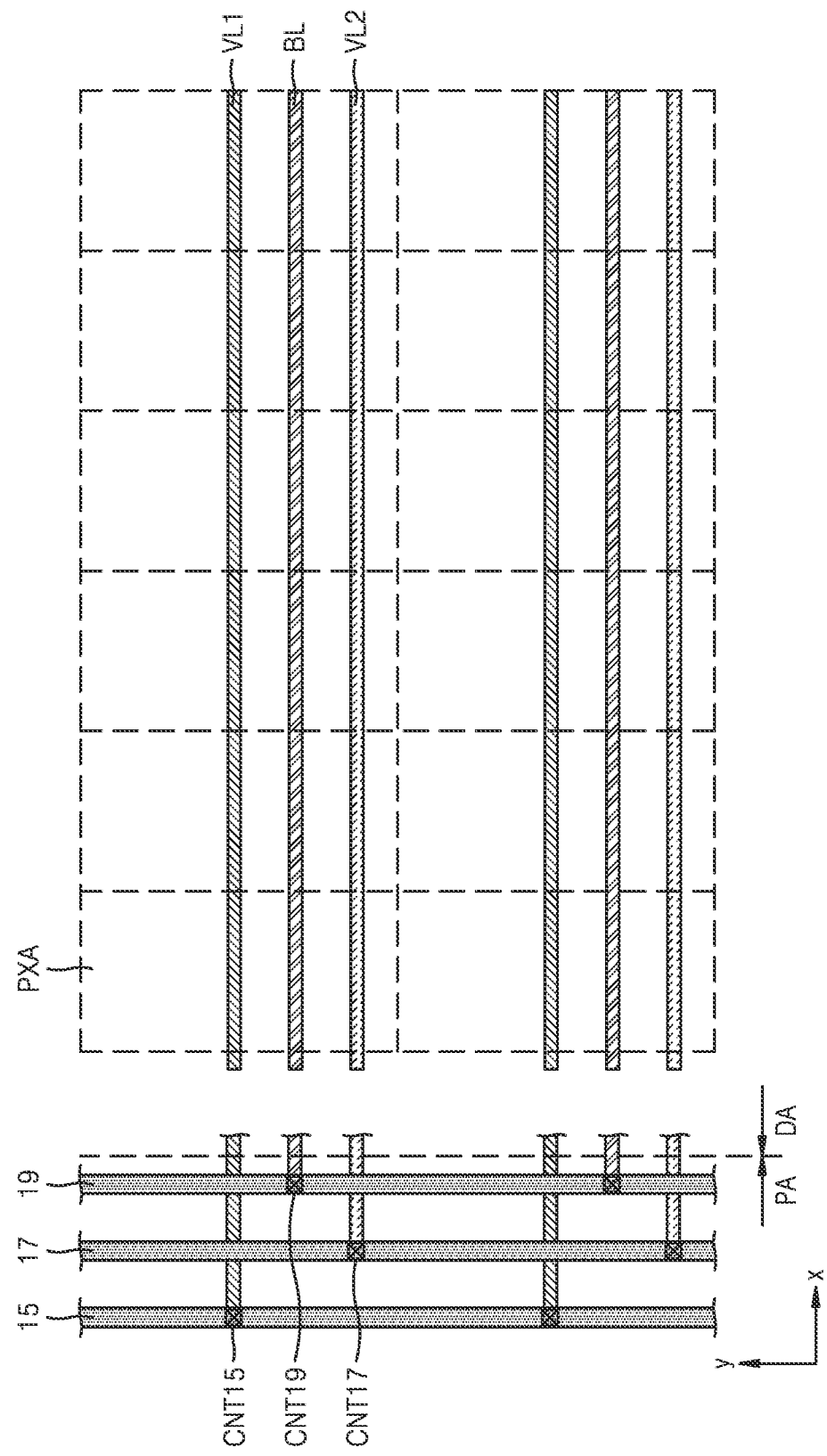
FIG. 9 is a schematic plan view of connection relationships between a voltage line and a voltage supply line in a display device according to an embodiment.

FIG. 9 is a schematic plan view showing connection relationships between a voltage line and a voltage supply line in a display device 1 according to an embodiment.

In an embodiment, a display device 1 may include at least one of the first initialization voltage line VL1, the second initialization voltage line VL2, and the bias voltage line BL extending in a first direction (e.g., direction ±x) in the display area DA. The first initialization voltage line VL1 (or the second initialization voltage line VL2 or the bias voltage line BL) and the first connection electrode layer CM1 may be arranged on a same layer.

At least one of the first initialization voltage supply line 15, the second initialization voltage supply line 17, and the bias voltage supply line 19 extending in a second direction (e.g., direction ±y) may be arranged in the peripheral area PA.

Referring to FIG. 3 together with FIG. 9, the first initialization voltage supply line 15 may be connected to the first initialization voltage line VL1 through a contact hole CNT15 to apply the first initialization voltage Vint to the pixel circuit PC. The second initialization voltage supply line 17 may be connected to the second initialization voltage line VL2 through a contact hole CNT17 to apply the second initialization voltage Vaint to the pixel circuit PC. The bias voltage supply line 19 may be connected to the bias voltage line BL through a contact hole CNT19 to apply the bias voltage Vbias to the pixel circuit PC.

According to the embodiments described above, a display device 1 in which at least one of multiple voltage lines applying voltage to a pixel circuit driving a display element includes multiple wires arranged on different layers, and display quality is improved may be provided. However, the disclosure is not limited by such an effect.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a display area and a peripheral area disposed adjacent to the display area;
a display element arranged in the display area;
a first semiconductor layer, a gate conductive layer, a first connection electrode layer, and a second connection electrode layer, sequentially arranged on a substrate; and
a bias voltage supply line arranged in the peripheral area, wherein
the bias voltage supply line comprises a top supply line and a bottom supply line arranged on different layers, and
the top supply line and the second connection electrode layer are arranged on a same layer, wherein
the first connection electrode layer and the top supply line overlap each other in a plan view.

2. The display device of claim 1, further comprising:
a functional layer arranged between the first semiconductor layer and the first connection electrode layer,
wherein the bottom supply line and the functional layer are arranged on a same layer.

3. The display device of claim 2, wherein
the gate conductive layer comprises a gate conductive line extending in a first direction,
the first connection electrode layer comprises a connection electrode line extending in the first direction,
the connection electrode line is electrically connected to the gate conductive line through a contact hole in the peripheral area, and
the bottom supply line comprises an open area corresponding to the contact hole.

4. The display device of claim 2, wherein a thickness of the functional layer in a thickness direction of the substrate is in a range of about 2000 Å to about 3000 Å.

5. The display device of claim 2, wherein the functional layer comprises aluminum (Al).

6. The display device of claim 2, further comprising:
a second semiconductor layer arranged on the functional layer, wherein
the gate conductive layer comprises:
a first gate conductive layer and a second gate conductive layer arranged between the first semiconductor layer and the functional layer; and a third gate conductive layer arranged on the second semiconductor layer, and the functional layer is arranged between the second gate conductive layer and the first connection electrode layer.

7. The display device of claim 6, wherein the first semiconductor layer comprises a silicon semiconductor, and the second semiconductor layer comprises an oxide semiconductor.

8. The display device of claim 1, wherein the bottom supply line and the first connection electrode layer are arranged on a same layer.

9. The display device of claim 8, wherein the first connection electrode layer comprises a connection electrode line extending in a first direction in the peripheral area, and the bottom supply line comprises an open area through which the connection electrode line passes.

10. The display device of claim 1, wherein the top supply line and the bottom supply line overlap each other in a plan view and are electrically connected to each other through a contact hole.

11. The display device of claim 1, further comprising:

a bias voltage line extending in a first direction in the display area, wherein the bias voltage line is electrically connected to the bias voltage supply line extending in a second direction in the peripheral area.

12. The display device of claim 11, further comprising:

a driving transistor that controls a volume of a driving current flowing to the display element, wherein the bias voltage line transfers a bias voltage to the driving transistor.

13. A display device comprising:

a display area and a peripheral area disposed adjacent to the display area;

a display element arranged in the display area and comprising a pixel electrode, an emission layer, and an opposite electrode;

a semiconductor layer, a gate conductive layer, a first connection electrode layer, and a second connection electrode layer, sequentially arranged on a substrate; and a first initialization voltage supply line, a second initialization voltage supply line, and a bias voltage supply line, arranged in the peripheral area, wherein at least one of the first initialization voltage supply line, the second initialization voltage supply line, and the bias voltage supply line comprises a top supply line and a bottom supply line arranged on different layers, and the top supply line and the second connection electrode layer are arranged on a same layer wherein the first connection electrode layer and the top supply line overlap each other in a plan view.

14. The display device of claim 13, wherein the bottom supply line and the first connection electrode layer are arranged on a same layer.

15. The display device of claim 14, wherein the first connection electrode layer comprises a connection electrode line extending in a first direction in the peripheral area, and the bottom supply line comprises an open area through which the connection electrode line passes.

16. The display device of claim 13, further comprising:

a functional layer arranged between the semiconductor layer and the first connection electrode layer, wherein the bottom supply line and the functional layer are arranged on a same layer.

17. The display device of claim 16, wherein the gate conductive layer comprises a gate conductive line extending in a first direction, the first connection electrode layer comprises a connection electrode line extending in the first direction, the connection electrode line is electrically connected to the gate conductive line through a contact hole in the peripheral area, and the bottom supply line comprises an open area corresponding to the contact hole.

18. The display device of claim 16, wherein the functional layer comprises aluminum (Al).

19. The display device of claim 13, further comprising:

a first initialization voltage line, a second initialization voltage line, and a bias voltage line, extending in a first direction in the display area, wherein the first initialization voltage line is electrically connected to the first initialization voltage supply line extending in a second direction in the peripheral area, the second initialization voltage line is electrically connected to the second initialization voltage supply line extending in the second direction in the peripheral area, and the bias voltage line is electrically connected to the bias voltage supply line extending in the second direction in the peripheral area.

* * * * *